(12) United States Patent
Chou et al.

(10) Patent No.: US 8,268,538 B2
(45) Date of Patent: Sep. 18, 2012

(54) METHOD FOR PRODUCING A THIN FILM TRANSISTOR

(75) Inventors: Lin-En Chou, Kao Hsiung Hsien (TW); Chia-Hao Tsai, Taipei Hsien (TW); Wen-Tung Wang, Hsinchu County (TW)

(73) Assignees: Taiwan TFT LCD Association, Hsinchu (TW); Chunghwa Picture Tubes, Ltd., Taoyuan (TW); AU Optronics Corp., Hsinchu (TW); Hannstar Display Corp., Taipei (TW); Chi Mei Optoelectronics Corp., Tainan County (TW); Industrial Technology Research Institute, Hsinchu (TW); Toppoly Optoelectronics Corp., Miao-Li County (TW)

( * ) Notice: Subject to any disclaimer, the term of this patent is extended or adjusted under 35 U.S.C. 154(b) by 754 days.

(21) Appl. No.: 12/353,345

(22) Filed: Jan. 14, 2009

(65) Prior Publication Data

US 2009/0121325 A1 May 14, 2009

Related U.S. Application Data

(63) Continuation-in-part of application No. 10/995,479, filed on Nov. 24, 2004, now abandoned.

(30) Foreign Application Priority Data

Aug. 31, 2004 (TW) .............................. 93126251 A

(51) Int. Cl.
*G03F 7/20* (2006.01)
(52) U.S. Cl. ....................................... 430/319; 264/293
(58) Field of Classification Search .................. 430/322, 430/311, 319; 264/293; 977/887
See application file for complete search history.

(56) References Cited

U.S. PATENT DOCUMENTS

| | | | |
|---|---|---|---|
| 5,900,160 A | 5/1999 | Whitesides et al. | |
| 6,060,121 A | 5/2000 | Hidber et al. | |
| 6,380,101 B1 | 4/2002 | Breen et al. | |
| 6,413,587 B1 | 7/2002 | Hawker et al. | |
| 6,518,189 B1 | 2/2003 | Chou | |
| 2002/0015897 A1* | 2/2002 | Toshine et al. | 430/2 |
| 2002/0071085 A1* | 6/2002 | Huang et al. | 349/149 |
| 2003/0186135 A1* | 10/2003 | Nakagawa et al. | 430/5 |
| 2003/0205657 A1* | 11/2003 | Voisin | 249/187.1 |
| 2004/0232495 A1* | 11/2004 | Saito et al. | 257/382 |

OTHER PUBLICATIONS

Andrews et al., Spinnable and UV-Patternable Hybrid Sol-Gel Silica Glass for Direct Semiconductor Dielectric Layer Manufacturing, SPIE, Mar. 1999, pp. 552-562, vol. 3678.

(Continued)

*Primary Examiner* — Brittany Raymond

(57) ABSTRACT

A method for producing a thin film transistor includes providing a glass substrate; disposing a positive photosensitive coating on the glass substrate; providing a transparent molding plate having a plurality of ladder opaque protrusions that are arranged in accordance with a predetermined pattern and that have at least two different depths; pressing the transparent molding plate into the positive photosensitive coating without contacting the glass substrate; exposing a part of the positive photosensitive coating which is unshielded under the ladder opaque protrusions, with a UV light; separating the transparent molding plate from the glass substrate after the step of exposing; and removing the part of the positive photosensitive coating, which is unshielded under the ladder opaque protrusions and not cured, using a chemical solvent, whereby the thin film transistor is formed in a pattern having more than two different depths.

12 Claims, 8 Drawing Sheets

OTHER PUBLICATIONS

Tohge et al., Direct fine-patterning of PZT thin films using photosensitive gel films derived from chemically modified metal-alkoxides, Journal of Materials Science, 1999, pp. 273-277, vol. 10.

Swirbel, Process for Fabricating Thin Film Multilayer Modules Using Photosensitive Epoxy Dielectrics, Electronic Components and Technology Conference, May 1997, pp. 967-971.

Park et al., Electrical properties of ferroelectric SBT thin films prepared using photosensitive sol-gel solution, Journal of Materials Science, 2003, pp. 1295-1300, vol. 38.

Barstow et al., Direct photopatterning of metal oxide materials using photosensitive organometallic precursor films, Proc. SPIE, 2002, pp. 421-430, vol. 4688.

Chu et al., Solid state photochemistry of thin films of Cr, MO and W organometallic compounds on silicon substrates, Materials Chemistry and Physics, 1996, pp. 135-139, vol. 43.

Tomonaga et al., Photochromic coatings including silver halide microcrystals via sol-gel process, Thin Solid Films, 2001, pp. 355-360, vol. 392.

Bargon et al., Lithographic Patterning of Conducting polymers and Their Composites, Synthetic Metals, 1991, pp. 1111-1114, vol. 41-43.

Bargon et al., Laser processing of electrically conducting polymers into patterns, Microelectronic Engineering, 1993, pp. 55-72, vol. 20.

Devaney et al., Structure and Properties of High Efficiency ZnO /CdZnS /CuInGaSe2 Solar Cells, IEEE Transactions on Electron Devices., Feb. 1990, pp. 428-433, vol. 37. No. 2.

Roy et al., Nanocomposite Field Effect Transistors based on Zinc oxide/polymer blends, Applied Physics Letters, May 2007, pp. 104-105, vol. 90.

* cited by examiner

METHOD FOR PRODUCING A THIN FILM TRANSISTOR

This application is a Continuation-in-Part of application Ser. No. 10/995,479, filed 24 Nov. 2004, and entitled Method for producing a thin film transistor and a device of the same.

BACKGROUND OF THE INVENTION

1. Field of the Invention

The present invention relates to a method for producing a thin film transistor, and particularly relates to a method, rather than a semiconductor process, for producing a thin film transistor.

2. Background of the Invention

A conventional method for producing a conventional thin film transistor uses semiconductor technology, which includes film deposition, photolithography technology, etching processes and the like. The film deposition process includes deposing a film of dielectric or insulating material by chemical vapor deposition (CVD) and deposing a film of electric material by physical vapor deposition (PVD). The photolithography and the etching processes define a pattern thereof. The equipment used for film deposition, photolithography and etching processes are all high-priced. As such, semiconductor technology, which consumes a lot of time and labor and requires expensive paraphernalia, is often criticized.

Referring to FIGS. 1A to 1D, the first prior art, a conventional photosensitive pressing method, illustrates a transparent plate $1a$ having a protrusion projected therefrom. The protrusion is transparent. A photosensitive material $3a$ is then poured between the transparent plate $1a$ and a glass substrate $2a$. The transparent plate $1a$ and a glass substrate $2a$ are separated yet are close to each other. Next an ultraviolet light is provided to cure the photosensitive material $3a$, which has been shaped between the transparent plate $1a$ and the glass substrate $2a$. After a dry or wet etching process, a resident part of the photosensitive material $3a$ will be removed, to form a pattern of a thin film transistor. However, by this stage all parts of the photosensitive material $3a$ have been cured because of the transparent protrusion, so the etching process is necessary. Furthermore, the transparent protrusion still plays another role as a photoresist that controls the depth of the pattern of the thin film transistor.

FIG. 2, a perspective view of a second prior art, U.S. Pat. No. 6,518,189, discloses a first conventional nanoimprint method. An opaque plate $1b$ has a protrusion projected therefrom, and presses onto a layer of thermoplastic polymer materials $3b$ that is coated on a substrate $2b$ in advance. Thermoplastic polymer materials $3b$, only melt at high temperatures (more than 300 degrees centigrade) and shaping requires large amounts of pressure. As such any press equipment that is used in the process should be resistant against the testing environment of these kinds of conditions. In addition, the layer of thermoplastic polymer materials $3b$ is cured after a cooling process and is further shaped by an etching process to produce a pattern.

With respect to FIG. 3, a perspective view of the third prior art, U.S. Pat. No. 5,900,160, discloses a first conventional microcontact method. A turbine mold $1c$ presses onto a substrate $2c$ that has a layer of micro-materials $3c$ in a rotating manner. This method however, lacks a precise and stable alignment. Furthermore, the mold $1c$ is made of Polydimethylsiloxane (PDMS) that wears out easily, deforms and has a negative effect on the precision of the pattern thereof.

The fourth prior art is displayed in FIGS. 4A to 4D which illustrate sequential perspective views as disclosed in U.S. Pat. No. 6,060,121, as a second conventional microcontact method. A plate $1d$ having a protrusion projected therefrom and an impression coating $3d$ formed thereon, presses a substrate $2d$ coated with a thin film $4d$. Although a pattern is formed, the thickness of the pattern is much thinner that that of other conventional methods necessitating an additional process with another material in order to increase the thickness of the pattern.

The fifth prior art is displayed in FIGS. 5A to 5D which illustrate sequential perspective views as disclosed in U.S. Pat. No. 6,380,101, as a third conventional microcontact method. A plate $1e$ having a protrusion projected therefrom and an impression coating $3e$ formed thereon, presses a substrate $2e$ coated with a thin film $4e$. Similarly to the first prior art, the impression coating $3e$ is further provided as a photoresist for post etching process.

The sixth prior art is displayed in FIGS. 6A to 6D which illustrate sequential perspective views as disclosed in U.S. Pat. No. 6,413,587, as a fourth conventional microcontact method. A plate $1f$ having a protrusion projected therefrom and an impression coating $3f$ formed thereon, presses a substrate $2f$ coated with a thin film $4f$. Similarly to the fourth prior art, an additional process is necessary with another material in order to increase the thickness of the pattern because of the thin impression coating $3f$.

In regards to the conventional microcontact methods according to the third to the sixth prior arts, the first step is to produce an impression mold made of polymer materials as the plate or mold for providing sufficient deformation in the pressing step. The impression mold should separate easily from the substrate after the pressing step. The impression mold however, often suffers from defective patterns due to the resilient property caused by the pressure that it experiences in the pressing step. So the pattern is often imprecise. Additionally, the impression mold reacts easily with non-polar organic solvents, such as toluene or hexane. When this occurs, the impression mold expands by a volume thereof due to its chemical property. As such, the peripheral environment should be controlled and monitored.

Hence, an improvement over the prior art is required to overcome the disadvantages thereof.

SUMMARY OF INVENTION

The primary objective of the invention is therefore to specify a thin film transistor that can replace the conventional semiconductor process with simple steps, thereby improving manufacturing efficiency and saving on production costs.

The secondary objective of the invention is therefore to specify a thin film transistor that can adjust the depth of a desired pattern directly, without additional etching or other processes.

According to the invention, these objectives are achieved by a method for producing a thin film transistor and include the following steps—preparing a glass substrate; having a positive photosensitive coating on the glass substrate; providing a transparent mold plate, which has a plurality of ladder opaque protrusions arranged in accordance with a predetermined pattern having different depth; controlling the transparent mold plate closely to press into the positive photosensitive coating and non-contacting to the glass substrate; exposing a part of the positive photosensitive coating, which is unshielded under the ladder opaque protrusions, via a UV light; and separating the transparent mold plate from the glass substrate, and removing the part of the positive photosensitive coating, which is unshielded under the ladder opaque protrusions and not cured, via a chemical solvent; whereby the thin film transistor is formed a pattern having different depth, after the positive photosensitive coating made from changeable material is pressed, cured, and cleaned.

According to the invention, these objectives are achieved by a thin film transistor that includes a glass substrate having a positive photosensitive coating formed thereon, and a part of the positive photosensitive coating being exposed via a UV light; a transparent mold plate including a plurality of ladder opaque protrusions disposed thereon, and the ladder opaque protrusions being arranged relevant to the predetermined pattern having different depth; and an adhesion layer formed between the transparent mold plate and the ladder opaque protrusions; and the adhesion layer having a coefficient of thermal expansion ranging between those of the transparent mold plate and the ladder opaque protrusions; wherein the other part of the positive photosensitive coating shielded under the ladder opaque protrusions is remained while the part of the positive photosensitive coating unshielded by the ladder opaque protrusions is removed via a chemical solvent; whereby the thin film transistor is formed a pattern having different depth, after the positive photosensitive coating is pressed, cured, and cleaned.

According to the invention, these objectives are achieved by a thin film transistor that include a glass substrate having a positive photosensitive coating formed thereon, and a part of the positive photosensitive coating being exposed via a UV light; a transparent mold plate including a plurality of ladder opaque protrusions disposed thereon, and the ladder opaque protrusions being arranged relevant to the predetermined pattern having different depth; and an adhesion layer formed between the transparent mold plate and the ladder opaque protrusions; and the adhesion layer having a coefficient of thermal expansion ranging between those of the transparent mold plate and the ladder opaque protrusions; wherein the other part of the positive photosensitive coating shielded under the ladder opaque protrusions is remained while the part of the positive photosensitive coating unshielded by the ladder opaque protrusions is removed via a chemical solvent; whereby the thin film transistor is formed a pattern having different depth, after the positive photosensitive coating is pressed, cured, and cleaned.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE EMBODIMENTS

The present invention produces a plurality of ladder opaque protrusions on a transparent mold plate, and then presses the transparent mold plate onto a substrate that has a positive photosensitive coating formed in advance. A part of the positive photosensitive coating is exposed via a UV light, thus removing the unshielded part via a chemical solvent, and the other part of the positive photosensitive coating shielded under the ladder opaque protrusion is defined the different depth on the predetermined pattern, thereby, defining both a predetermined pattern and different depth of the predetermined pattern simultaneously without additional etching or other processes.

The method according to the present invention can be brought into practice to each layer of a thin film transistor by taking different photosensitive materials with specific properties; for example, a semiconductor photosensitive material can be used as a semiconductor layer and the like, such as active layer or an ohmic contact layer; a conductive material can be used as a conductive line or a electrode layer, such as a gate electrode, a source electrode, a drain electrode, a contact pad, a capacitance electrode, a circuit line and so on; an insulating material is used for isolation, such as an insulator layer, a dielectric layer or a passivation layer. These layers mentioned above need more steps if produced by a conventional semiconductor process. These additional steps ensure that the method according to the present invention is effective and that the expensive equipment that the conventional semiconductor process needs are not required.

Figure 1A:
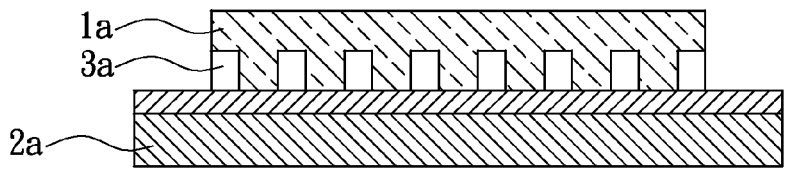
FIGS. 1A to 1D are sequential perspective views according to a conventional photosensitive pressing method as the first example of prior art.
Figure 1B:
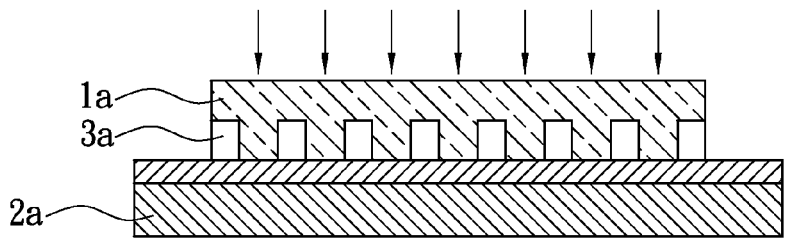
Figure 1C:
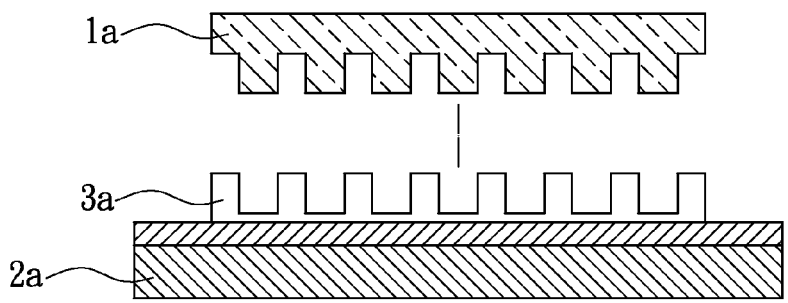
Figure 1D:
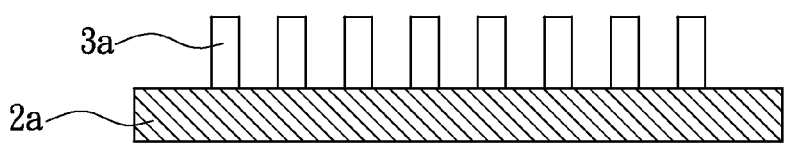
Figure 2:
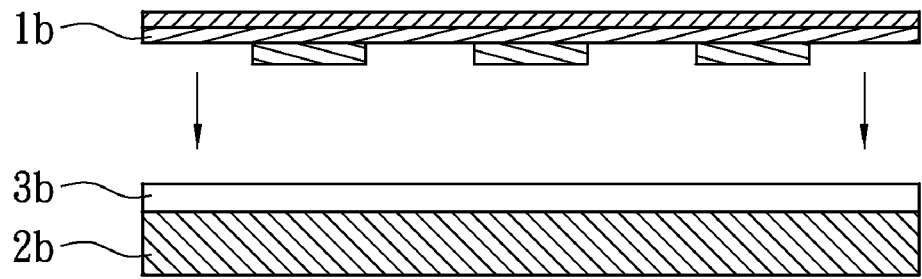
FIG. 2 is a perspective view according to a first conventional nanoimprint method patented by U.S. Pat. No. 6,518,189 as the second example of prior art.
Figure 3:
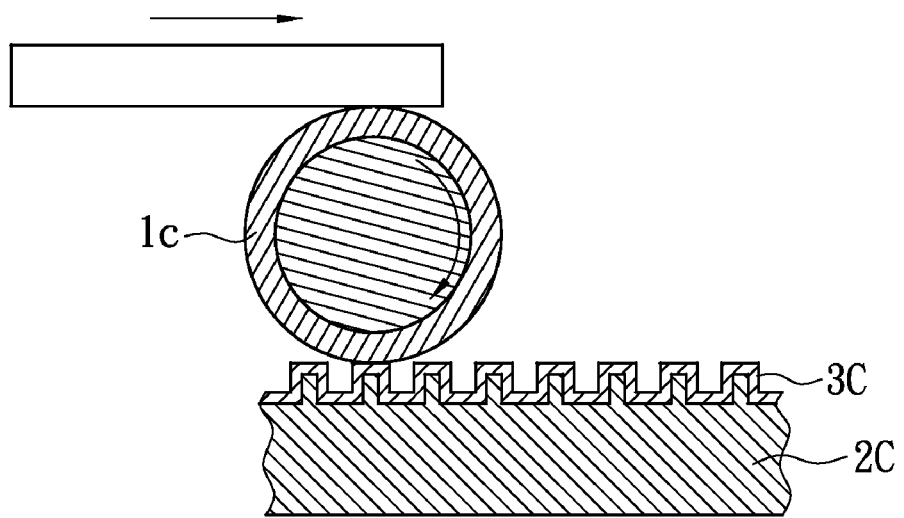
FIG. 3 is a perspective view according to a first microcontact method patented by U.S. Pat. No. 5,900,160 as the third example of prior art.
Figure 4A:
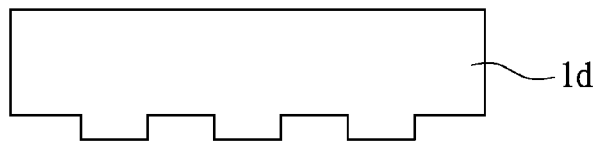
FIGS. 4A to 4D are sequential perspective views according to a second microcontact method patented by U.S. Pat. No. 6,060,121 as the fourth example of prior art.
Figure 4B:
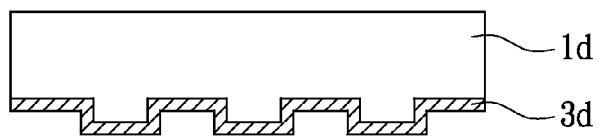
Figure 4C:
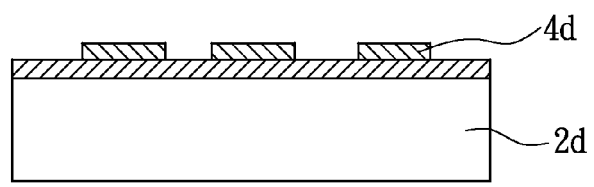
Figure 4D:
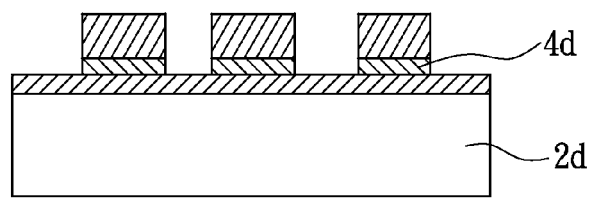
Figure 5A:
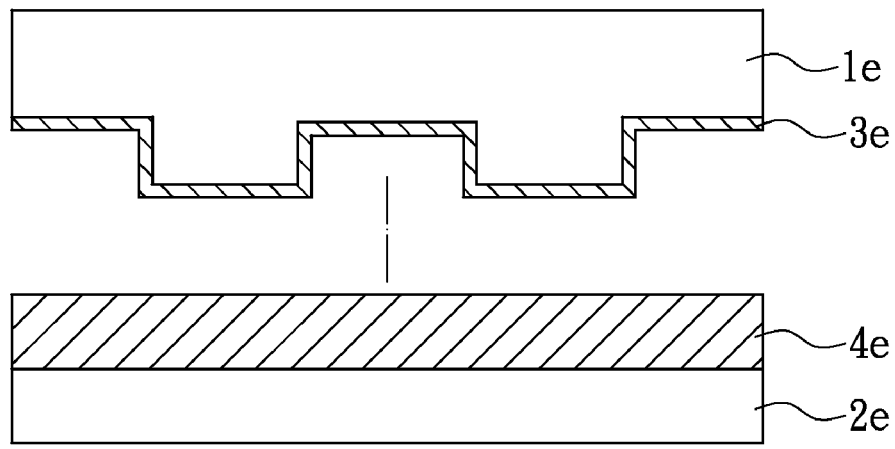
FIGS. 5A to 5D are sequential perspective views according to a third microcontact method patented by U.S. Pat. No. 6,380,101 as the fifth example of prior art.
Figure 5B:
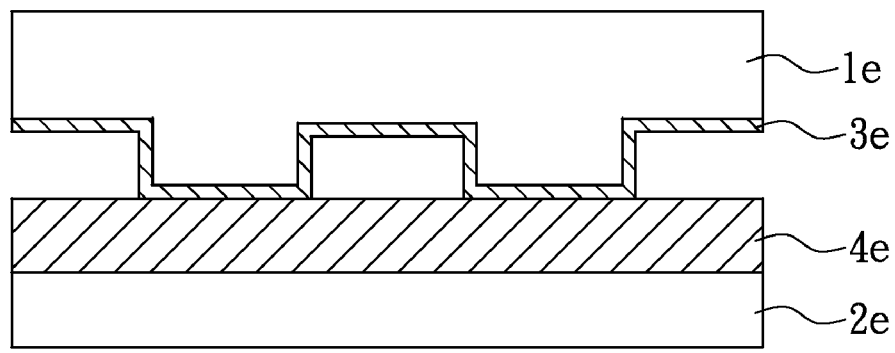
Figure 5C:
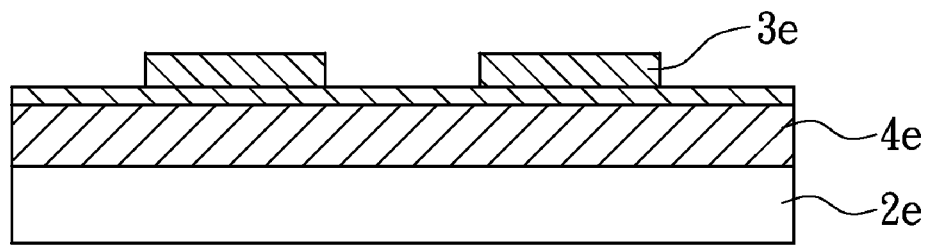
Figure 5D:
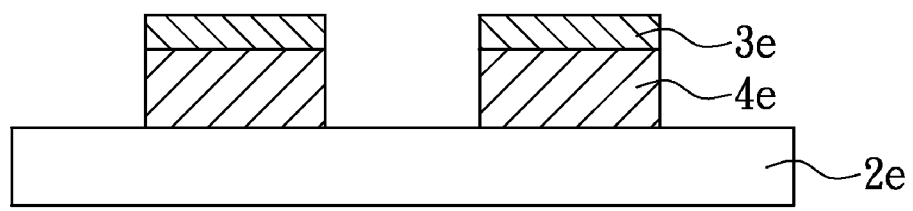
Figure 6A:
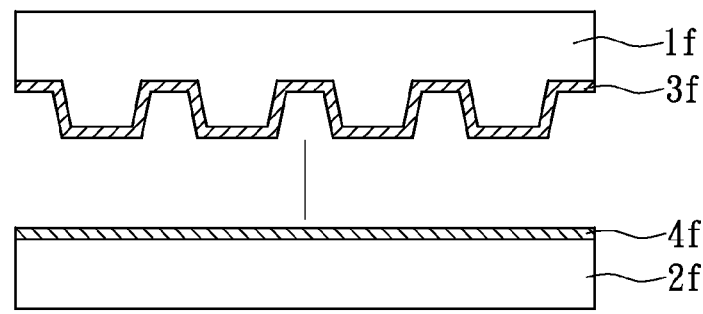
FIGS. 6A to 6D are sequential perspective views according to a fourth microcontact method patented by U.S. Pat. No. 6,413,587 as the sixth example of prior art.
Figure 6B:
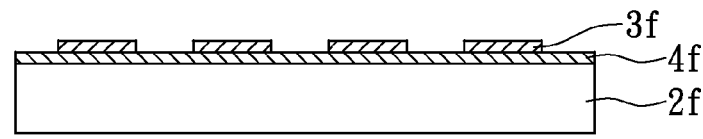
Figure 6C:
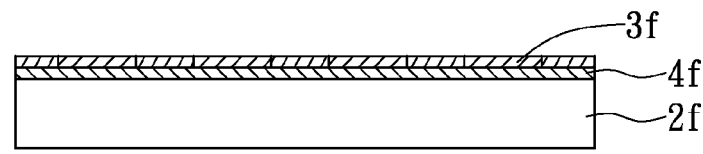
Figure 6D:
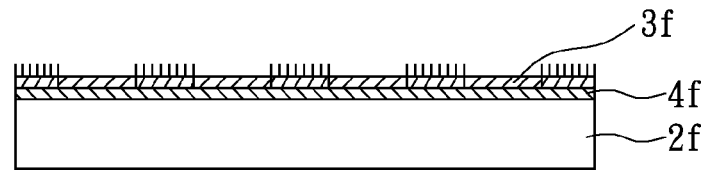
Figure 7A:
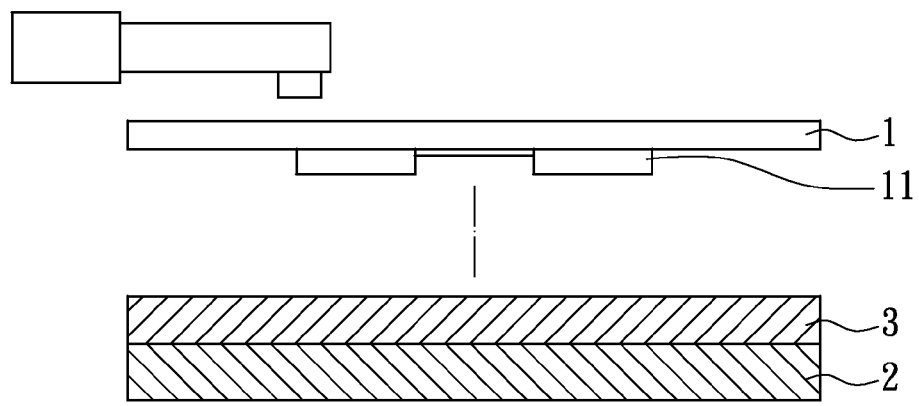
FIGS. 7A to 7C are sequential perspective views of thin film transistor of a preferred embodiment according to the present invention.
Figure 7B:
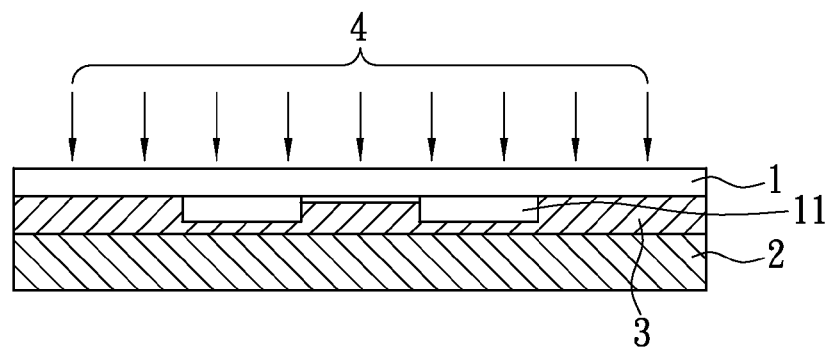
Figure 7C:
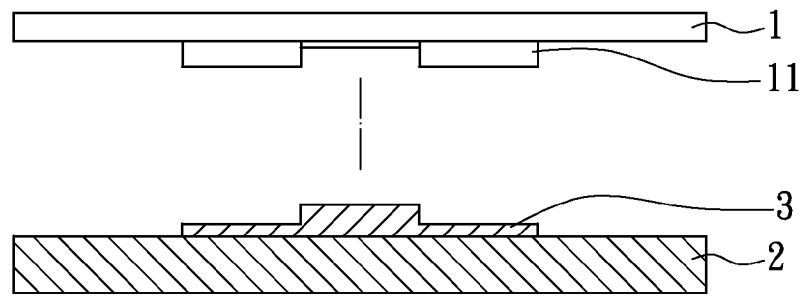
Figure 8:
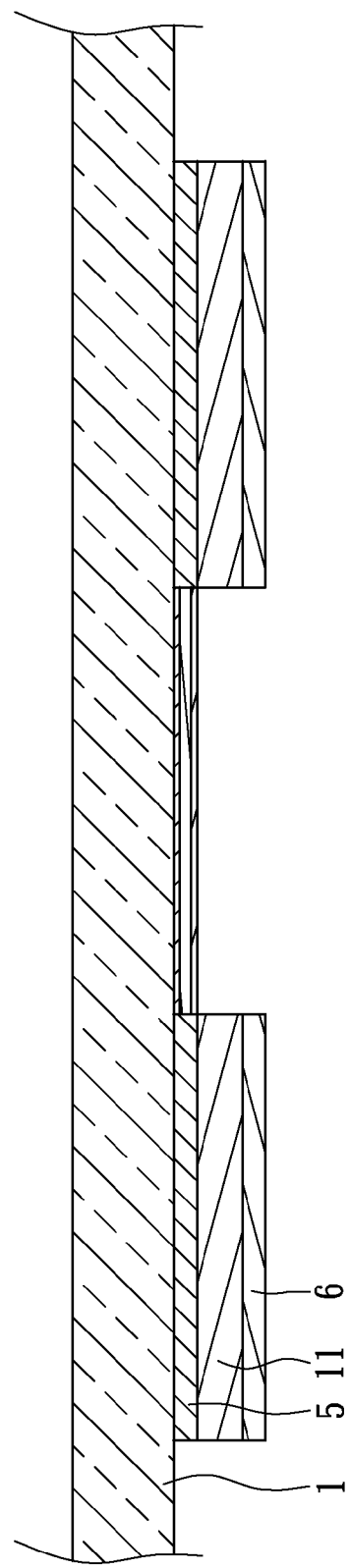
FIG. 8 is a side view of a mold plate according to the present invention.

With respect to FIGS. 7A to 7C, a method for producing a thin film transistor of sequential perspective views according to the present invention includes the following steps. Firstly, preparing a glass substrate 2 prior to providing a positive photosensitive coating 3 on the glass substrate 2 in a spin-coating manner as shown in FIG. 7A. Secondly, providing a transparent mold plate 1, which then has a plurality of ladder opaque protrusions 11 in accordance with a predetermined pattern having the different depth. Thirdly, in FIG. 7B, the transparent mold plate 1 is controlled to press closely to the positive photosensitive coating 3 of the glass substrate 2 with uniform pressure, and non-contacting to the glass substrate 2. The positive photosensitive coating 3 is a kind of fluid, so that the positive photosensitive coating 3 is forced with a at least two predetermined depth by the ladder opaque protrusions 11 and flows to fill a space between the transparent mold plate 1 and the glass substrate 2. A part of the positive photosensitive coating 3, which is not shielded under the opaque protrusions 1, is exposed via a UV light 4. FIG. 7C shows that the other part of the positive photosensitive coating 3, which is shielded under the ladder opaque protrusions 1 and not exposed thereby, a part of the unshielded positive photosensitive coating 3 is removed via a chemical solvent, after the transparent mold plate 1 is separated from the glass substrate 2. Therefore, the positive photosensitive coating 3 is finally formed with the predetermined pattern having at least two different depths. The positive photosensitive coating 3 can be made of semiconductor, conductive or insulating materials. The thin film transistor is formed after the positive photosensitive coating 3 is pressed, cured, and cleaned in a sequential manner. The transparent mold plate 1 is made of glass material or quartz; the ladder opaque protrusions 11 are made of metallic material, such as Cr, Mo or W. At this stage the height of the ladder opaque protrusions 11 are a little less than their required height at the end of the process.

The transparent mold plate 1 is cleaned by part of the conventional semiconductor process. Furthermore, the transparent mold plate 1 can be deposed with an adhesion layer 5 (a kind of a metallic oxide) prior to being disposed with the protrusions 11 (a kind of a metallic thin film) wherein the adhesion layer 5 has a coefficient of thermal expansion ranging between those of the transparent mold plate 1 and the opaque protrusions 11. The adhesion layer 5 is made of a metallic oxide that is made from a predetermined metal. The predetermined metal is one of the transition metals, which includes Cr, Mo or W; and the metallic oxide is a transition-metal oxide corresponding to the predetermined metal. According to a proffered embodiment, the transparent mold plate 1 is deposed with a chromium oxide, which has a thickness of less than 500 .ANG. The transparent mold plate 1 with the chromium oxide is then further deposited with a layer of chromium (Cr). The layer of chromium has a real thickness a little less than the anticipated predetermined depth of the predetermined pattern, and a difference, between the real thickness and the anticipated depth, exists due to the forcing pressure of the transparent mold plate 1 and properties of viscosity of the opaque protrusions 11 and the negative photosensitive coating 3. The difference should be within or no more than 10%. The layer of the protrusions 11, the metallic thin film, and the layer of adhesion layer 5, metallic oxide, are further processed by photo and etching processes (like dry-etching, wet etching, using an E-beam process or laser writing) simultaneously, so as to form as a plurality of the protrusions 11 corresponding to the predetermined pattern. After the protrusions 11 are defined, a transparent material (like Teflon) will be deposed onto a surface each of the protrusions 11. Because Teflon is de-wetted from the negative photosensitive coating 3, Teflon is called a dewetting layer 6.

An image sensor is provided in order to align with both of the transparent mold plate 1 and the glass substrate 2. The image sensor is a charge coupled device (CCD) and complementary metal-oxide semiconductor (CMOS) selectively. Advantages of the present invention are summarized as follows:

1. To replace the conventional semiconductor process with simple steps, so as to improve efficiency and save on production costs.
2. To adjust the predetermined at least two different depths of the desired pattern directly with the chemical solvent, without additional etching or other processes; this will also lower costs.
3. The method can be practiced in each layer of the thin film transistor.
4. The protrusions are made of metal materials with rare deformation, so they are more precise and accurate.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method for producing a thin film transistor, comprising the steps of:
   providing a glass substrate;
   disposing a positive photosensitive coating on the glass substrate;
   providing a transparent molding plate having a plurality of ladder opaque protrusions that are arranged in accordance with a predetermined pattern and that have at least two different depths;
   pressing the transparent molding plate into the positive photosensitive coating without contacting the glass substrate;
   exposing a part of the positive photosensitive coating which is unshielded under the ladder opaque protrusions, with a UV light;
   separating the transparent molding plate from the glass substrate after the step of exposing; and
   removing the part of the positive photosensitive coating, which is unshielded under the ladder opaque protrusions and not cured, using a chemical solvent,
   whereby the thin film transistor is formed in a pattern having at least two different depths, after the positive photosensitive coating made from changeable material is pressed, cured, and cleaned.

2. The method for producing the thin film transistor as claimed in claim 1, wherein disposing the positive photosensitive coating on the glass substrate is accomplished using spin-coating.

3. The method for producing the thin film transistor as claimed in claim 1, wherein the part of the positive photosensitive coating is pressed to a predetermined depth by the transparent molding plate.

4. The method for producing the thin film transistor as claimed in claim 1, wherein the positive photosensitive coating is made of a semiconductor material or a conductive material.

5. The method for producing the thin film transistor as claimed in claim 1, wherein the transparent molding plate is made of a glass material or quartz and the ladder opaque protrusions are made of metallic material.

6. The method for producing the thin film transistor as claimed in claim 5, further comprising arranging an adhesion layer between the transparent molding plate and the ladder opaque protrusions, wherein the adhesion layer has a coefficient of thermal expansion ranging between those of the transparent molding plate and the ladder opaque protrusions.

7. The method for producing the thin film transistor as claimed in claim 6, wherein the adhesion layer is made of a metallic oxide comprised of a predetermined metal.

8. The method for producing the thin film transistor as claimed in claim 7, wherein the predetermined metal is selected from the group consisting of Cr, Mo and W, and wherein the metallic oxide is a transition-metal oxide corresponding to the predetermined metal.

9. The method for producing the thin film transistor as claimed in claim 5, further comprising arranging a dewetting layer, which is de-wetted from the positive photosensitive coating, onto the metallic material.

10. The method for producing the thin film transistor as claimed in claim 9, wherein the dewetting layer is made of Teflon.

11. The method for producing the thin film transistor as claimed in claim 1, further comprising providing an image sensor in order to align with both the transparent molding plate and the glass substrate.

12. The method for producing the thin film transistor as claimed in claim 11, wherein the image sensor is a charge coupled device (CCD) or a complementary metal-oxide semiconductor (CMOS).

* * * * *